(12) United States Patent
Mahdavi (10) Patent No.: US 12,310,150 B2
(45) Date of Patent: May 20, 2025

(54) OPTOELECTRONIC DEVICE HAVING A PHOTONIC CRYSTAL STRUCTURE

(71) Applicant: OSRAM Opto Semiconductors GmbH, Regensburg (DE)

(72) Inventor: Ali Mahdavi, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 576 days.

(21) Appl. No.: 17/632,903

(22) PCT Filed: Aug. 6, 2019

(86) PCT No.: PCT/EP2019/071095
§ 371 (c)(1),
(2) Date: Feb. 4, 2022

(87) PCT Pub. No.: WO2021/023374
PCT Pub. Date: Feb. 11, 2021

(65) Prior Publication Data
US 2022/0320376 A1 Oct. 6, 2022

(51) Int. Cl.
*H10H 20/831* (2025.01)
*H01L 25/07* (2006.01)
(Continued)

(52) U.S. Cl.
CPC ......... *H10H 20/831* (2025.01); *H01L 25/072* (2013.01); *H01L 25/0753* (2013.01);
(Continued)

(58) Field of Classification Search
CPC ............... H01L 33/38; H01L 25/0753; H01L 25/072; H01L 2933/083; H01L 20/831; H01L 20/032; H01L 20/872; H01L 25/167
See application file for complete search history.

(56) References Cited

U.S. PATENT DOCUMENTS 9,041,012 B2 *  5/2015  Bae ..................... H01L 33/42
                                                            257/91
2009/0184334 A1  7/2009  Lee et al.
(Continued)

FOREIGN PATENT DOCUMENTS

EP   1 467 415 A2   10/2004
EP   1 855 327 A2   11/2007

OTHER PUBLICATIONS

International Search Report issued for corresponding International Patent Application No. PCT/EP2019/071095 on Apr. 6, 2020.
(Continued)

*Primary Examiner* — Alonzo Chambliss
(74) *Attorney, Agent, or Firm* — Hauptman Ham, LLP (57) ABSTRACT

An optoelectronic device includes at least one optoelectronic light source having an active region for generating light and a light emitting surface for emitting the generated light, an electrically conductive layer extending between the light emitting surface and the active region, and a photonic crystal structure. The photonic crystal structure is arranged in the electrically conductive layer. The at least one optoelectronic light source is a plurality of optoelectronic light sources. The optoelectronic light sources of the plurality of optoelectronic light sources are arranged in an array-like structure. Each of the optoelectronic light sources has an active region which is separate from the active regions of the other optoelectronic light sources. The electrically conductive structure extends over all optoelectronic light sources of the plurality of optoelectronic light sources.

19 Claims, 6 Drawing Sheets

(51) Int. Cl.
*H01L 25/075* (2006.01)
*H01L 25/16* (2023.01)
*H10H 20/01* (2025.01)
*H10H 20/80* (2025.01)
*H10H 20/813* (2025.01)

(52) U.S. Cl.
CPC ......... *H01L 25/167* (2013.01); *H10H 20/032* (2025.01); *H10H 20/872* (2025.01)

(56) References Cited

U.S. PATENT DOCUMENTS

| | | | |
|---|---|---|---|
| 2015/0236194 A1* | 8/2015 | Bae | H01L 33/387 438/34 |
| 2019/0165209 A1* | 5/2019 | Bonar | H01L 33/46 |
| 2019/0235234 A1* | 8/2019 | Hu | G09G 3/346 |
| 2022/0102583 A1* | 3/2022 | Baumheinrich | G02B 6/105 |
| 2022/0223771 A1* | 7/2022 | Behringer | H10H 20/84 |

OTHER PUBLICATIONS

Written Opinion issued for corresponding International Patent Application No. PCT/EP2019/071095 on Apr. 6, 2020.

* cited by examiner

OPTOELECTRONIC DEVICE HAVING A PHOTONIC CRYSTAL STRUCTURE

CROSS REFERENCE TO RELATED APPLICATION

This application is a National Stage of International Application No. PCT/EP2019/071095, filed on Aug. 6, 2019, which designates the United States and was published in Europe. The aforementioned application is hereby incorporated by reference in its entirety.

The present invention relates to an optoelectronic device and a method for producing an optoelectronic device.

An optoelectronic device, such as a display, may comprise a plurality of optoelectronic light sources, such as LEDs or μLEDs that are arranged in an array-like structure. Each optoelectronic light source may form a subpixel in the array-like structure. The subpixel can be configured to emit red, green or blue light. A pixel may include three subpixels and thus three light sources. One light source may be configured to emit red light, one light source may be configured to emit green light, and one light source may be configured to emit blue light. For such optoelectronic devices that comprise one or more optoelectronic light sources it is desirable that the emitted light has an acceptable directivity and that the light extraction efficiency is sufficiently high.

It is an object of the present invention to provide an improved optoelectronic device.

The object is satisfied by an optoelectronic device in accordance with the features of claim 1. The dependent claims describe preferred embodiments of the present invention.

In accordance with the present invention, an optoelectronic device comprises at least one optoelectronic light source with an active region for generating light and with a light emitting surface for emitting the generated light. An electrically conductive layer extends between the light emitting surface and the active region, and a photonic crystal structure is arranged in the electrically conductive layer.

The electrically conductive layer serves to provide electricity to one pole of the active zone. However, as this layer comprises a photonic crystal structure, it provides several further advantages. For example, by introducing the photonic crystal structure into the electrically conductive layer the light extraction and the directionality of the extracted light can be improved while maintaining the current spreading capability. Furthermore, the photonic crystal structure can help to avoid or reduce crosstalk between the optoelectronic light sources. Crosstalk is unwanted transfer of light to neighboring pixels and regions. This results in simultaneous illumination of adjacent pixels when a single pixel is addressed. In displays this can result in reduced image fidelity and lower signal to noise ratio in optical communication devices.

Crosstalk can occur when generated light by an optoelectronic light source travels along the electrically conductive layer to another, for example neighboring, optoelectronic light source. There, the light may be absorbed in the active zone of the optoelectronic light source and re-emit.

Photonic crystal structures per se are known. A photonic crystal is a periodic or quasi-periodic optical nanostructure that can affect the propagation of electromagnetic waves. Photonic crystals can be composed of regularly repeating regions of high and low dielectric constant.

In some embodiments, the electrically conductive layer comprises a 2-dimensional photonic crystal structure. The 2-dimensional photonic crystal structure can have a periodic or quasi-periodic variation of the index of refraction along a first axis, for example an x-axis, and along a second axis, for example a y-axis. The first and second axes are perpendicular to each other and they can be in a plane that is parallel to the light emitting surface. In other words, the first and second axis can be orthogonal to a third axis, for example a z-axis. The third axis is orthogonal to the light emitting surface and thus, the third axis can correspond to the main direction of the radiation emitted by the optoelectronic device.

The photonic crystal structure can be designed such as to provide a photonic bandgap at least for electromagnetic radiation of a defined wavelength or in a defined wavelength regime and for the electromagnetic radiation that travels in a lateral direction in the conductive layer. The lateral direction is parallel to the light emitting surface. The lateral direction can therefore be in the plane spanned by the first and second axes.

The material of the electrically conductive layer and the geometrical parameters of the photonic structure crystal can be set such as to optimize the bandgap. The geometrical parameters can for example include the radius of the holes in the conductive layer, the pitch and/or the height of holes.

The wavelengths covered by the bandgap can correspond to the wavelengths of the light generated by the optoelectronic light source. Thus, the photonic bandgap can be designed to block light generated by the optoelectronic light source from traveling in the electrically conductive layer in the lateral direction, i.e. in a direction that is parallel to the light emitting surface. Thus, crosstalk between neighboring optoelectronic light sources can be reduced or prevented. In some embodiments, the crosstalk can be reduced to 1% with patterning the conductive layer using optimized lattice parameters, whereas the power emission transferred to neighboring chips can be as high as 14% of the total emission when conductive layer is pristine.

The structural formation also allows bandstructure engineering in order to optimize light extraction and improve directionality. Moreover, if a specific farfield emission pattern is of interest within the chosen region with the optimized light extraction efficiency, one can tune the bandstructure in order to achieve an optimized directionality in the normal direction or any angle of interest.

In some embodiments of the present invention, the at least one optoelectronic light source is a plurality of optoelectronic light sources. The optoelectronic light sources of the plurality of optoelectronic light sources can be arranged in an array-like structure, and each of the optoelectronic light sources can have an active region, which is separate from the active regions of the other optoelectronic light sources. The active regions of the optoelectronic light sources can be operated individually. The electrically conductive layer can cover all optoelectronic light source and can serve to provide electricity to one electric pole of each optoelectronic light source. The conductive layer can therefore serve as current spreading layer.

The electrically conductive layer might extend over all optoelectronic light sources of the plurality of optoelectronic light sources. The electrically conductive layer therefore may form a separate layer above the optoelectronic light sources, and the electrically conductive layer may completely cover the top side of the light sources.

The photonic crystal structure might also extend in the first and second direction over the complete electrically conductive layer. Thus, the refractive index of the photonic crystal structure may vary periodically along the first and second axes.

The photonic crystal structure might comprise a plurality of holes formed in the electrically conductive layer, and the holes might form a lattice, such as a square lattice or a hexagonal lattice. A hexagonal lattice is sometimes called triangular lattice.

The holes that form the hexagonal lattice can be etched into the electrically conductive layer, in particular such that the dimensioning of the lattice causes the creation of a bandgap in a desired wavelength range or at a desired wavelength. The bandgap can in particular prevent optical modes to propagate laterally, i.e. in the plane defined by the first and second axes. Thereby, crosstalk can be prevented or reduced.

The photonic crystal structure can also help with coupling guided modes in the active region to an extraction cone resulting in enhanced light extraction. The extraction cone can have a center axis which is parallel to the third axis, and its opening angle can be dependent on the photonic crystal structure and/or the created bandgap. In particular, the opening angle can be decreased due to the presence of the photonic crystal structure. Thereby directionality can be improved. Since the photonic crystal structure can provide a bandgap for laterally propagating photons it can help in improving the directionality of the emitted light as well by confining the scattered light more toward the normal angles, i.e. in the direction normal to the light emitting surface.

The holes can be filled with a dielectric material having an index of refraction that differs from the index of refraction of the electrically conductive layer. Alternatively, the holes can be filled with air or another gaseous material.

Each hole might comprise a center axis, the center axes of the plurality of holes can be arranged in parallel to each other. In some embodiments of the invention, each hole comprises a center axis, and the center axes of the plurality of holes can be arranged orthogonal to the light emitting surface. In some embodiments of the invention, each hole has a circular cross section.

In some embodiments of the invention, the at least one optoelectronic light source is a μLED. The μLED can have a size in the range between 10 μm and 1 μm, preferably between 5 μm and 1 μm and further preferably between 2 μm and 1 μm. The size is measured along the first axis. The μLED can have a quadratic or close to quadratic cross section in the plane defined by the first and second axis.

In some embodiments of the invention, the electrically conductive layer has a height in the range between 350 nm and 140 nm, preferably a height of 300 nm or of 150 nm. The photonic crystal structure and in particular a hexagonal structure with holes in the electrically conductive layer helps to stabilize the conductive structure and allows forming an electrically conductive layer with a height of 300 nm or 150 nm on top of an array of μLEDs.

The electrically conductive layer is preferably made of a transparent or partly transparent material.

The electrically conductive layer can be made of Indium tin oxide. This material is also called ITO. However, ITO is only mentioned as one example.

The etching of the electrically conductive layer, such as an ITO layer, to form the photonic crystal structure influences slightly the current spreading functionality of the layer, according to the amount of removed material compared to bulk. The holes might be etched completely or partially through the electrically conductive layer. The photonic crystal structure also allows producing a thicker material deposition on the light sources and in particular on the μLEDs. Usually a thick material layer, such as an ITO layer or any other current spreading layer with high doping concentration, would result in huge crosstalk and reduction of light extraction efficiency. This problem can be avoided by producing the photonic crystal structure with a bandgap that blocks propagation of the light in the lateral direction.

According to numerical simulations, the crosstalk between neighboring μLEDs can be as much as 80% of the out-of-plane light emission, if no photonic crystal structure is arranged in an electrically conductive layer shared between the μLEDs. This might result in unresolvable and indistinguishable chips. Thus, the use of a photonic crystal structure in an electrically conductive layer which is shared between a plurality of μLEDs helps to obtain higher image fidelity and resolved pixels.

In some embodiments, the photonic crystal structure is formed by a hexagonal pattern of holes in the electrically conductive layer. Moreover, the electrically conductive layer can have a thickness of 300 nm, a hole radius of 178.2 nm, and a pitch of 540 nm.

The light emitting surface can be the top surface of one or more layers arranged on top of the electrically conductive layer. Such layer or layers are preferably electrically insulating layers and/or transparent or at least partly transparent. The light emitting surface can alternatively be formed by the top surface of the electrically conductive layer.

The photonic crystal structure can be designed, in particular with respect to its thickness, pitch and radius of holes, such that trapped modes and/or guided modes couple to an extraction cone for the emitted light. Thus, the bandstructure can be tailored, in particular by adjusting the thickness, pitch and hole radius, such that the extraction efficiency and directivity can be enhanced or optimized. In bandstructure, the center of the radiation cone usually coincides with the Γ-point, the high symmetry point in the Brillouin zone where kx=ky=0. At this point radiation modes radiate out-of-plane in the z-direction The invention also relates to a method for producing an optoelectronic device, in particular an optoelectronic device in accordance with the present invention, the method comprising the steps of:

providing at least one optoelectronic light source having an active region for generating light, providing an electrically conductive layer above the active region, and generating a photonic crystal structure in the electrically conductive layer.

Preferably, the electrically conductive layer is provided on the side of the active region that is intended for light emission. Above the electrically conductive layer, one or more additional layers that are preferably non-conducting and transparent can be arranged. The top side of these layers can form the light emitting surface through which the light produced in the active region can leave the device.

In some embodiments, the at least one optoelectronic light is formed by a plurality of optoelectronic light sources. The method can comprise that the optoelectronic light sources of the plurality of optoelectronic light sources are arranged in an array-like structure, and each of the optoelectronic light sources has an active region, which is separate from the active regions of the other optoelectronic light sources.

In some embodiments, the optoelectronic light sources are individual light sources, preferably individual μLEDs, which are arranged in the array-like structure. The μLEDs can be formed by dicing a wafer of μLEDs into individual μLEDs.

The electrically conductive structure might be provided on the optoelectronic light sources of the plurality of optoelectronic light sources such as to extend over all the optoelectronic light sources. The electrically conductive structure therefore forms a layer, which is shared by all light sources and which can be used for spreading electrical current between the light sources.

Preferred embodiments of the present invention will now be described by way of example only and with reference to the accompanying drawings in which:

FIG. 2 shows schematically an electrically conductive layer with a photonic crystal structure arranged in the device of FIG. 1a.

Figure 1A:
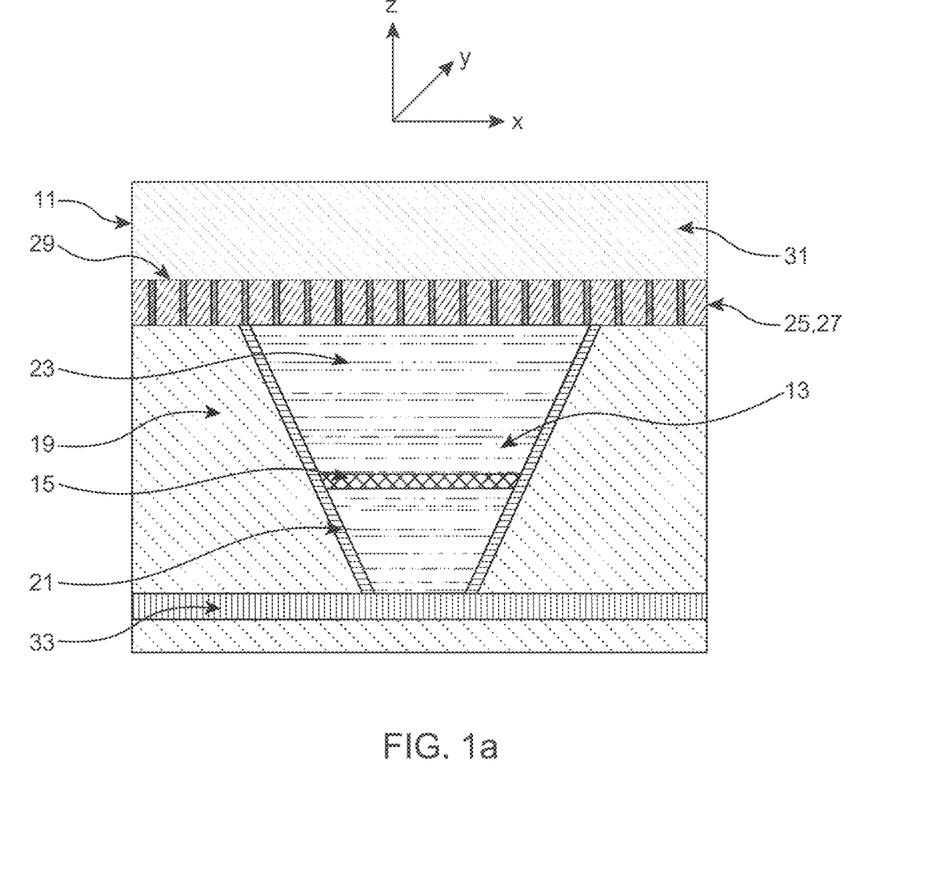
FIG. 1a shows schematically a cross-sectional view of an exemplary embodiment of an optoelectronic device in accordance with the present invention.

FIG. 1a shows schematically a cross-sectional view of an exemplary embodiment of an optoelectronic device in accordance with the present invention. The view was obtained from a numerical simulation. Outer frame 11 limits the calculation area and serves to define boundary conditions for the numerical simulation. The frame 11 is not a component of the physical optoelectronic device.

The optoelectronic device shown in FIG. 1a is preferably a μLED and comprises an optoelectronic light source 13 having an active region 15 for generating light. The active region 15 comprises a quantum well emission region in which light in a defined wavelength region is generated.

Emission of the active region 15 can have a directivity that corresponds to dipole emission. The layer structure that forms the active region 15 is embedded in a funnel-like mesa boundary 19, which has a metal and passivation layer 21 on its inner surface. The metal and passivation layer 21 provides some reflectivity that directs the light upwards in the z-direction.

An optional reflecting element (not shown), for example a layered structure that forms a Bragg reflector, can be arranged below the active region 15 to reflect light upwards in the z-direction.

One or more epitaxial layers 23 are arranged on top of the active region 15. An electrically conductive layer 25 is arranged on top of the epitaxial layers 25. The epitaxial layers 23 and the electrically conductive layer 25 are transparent or at least partly transparent for the light emitted in the active region 15. Furthermore, a photonic crystal structure 27 is arranged in the electrically conductive layer 25.

Above the photonic crystal structure 27, one or more additional layers can be arranged, and the top surface of these layers can form the light emitting surface. Alternatively, the top side of the electrically conductive layer 25 can serve as light emitting surface 29 through which the generated light can leave the device. On top of the light emitting surface 29 can be air 31.

The electrically conductive layer 25 serves as a current spreading layer to provide an electric current to an n-contact of the active region 15. Furthermore, a p-contact of the active region 15 is provided with electricity via a bottom metallic layer 33.

By introducing the photonic crystal structure 27 into the electrically conductive layer 25 the light extraction and the directionality of the extracted light is enhanced while the capability of providing electricity to the active region 15 of the optoelectronic light source 13 is maintained. This can for example be achieved by designing the photonic crystal structure 27 such that trapped modes and/or guided modes of the structure 27 are coupled to an extraction cone of the emitted light. Furthermore, as will be explained further below, the height of the electrically conductive layer 25 can be increased due to the photonic crystal structure 27, resulting in further improvement of the electric conductivity of the layer 25.

Figure 1B:
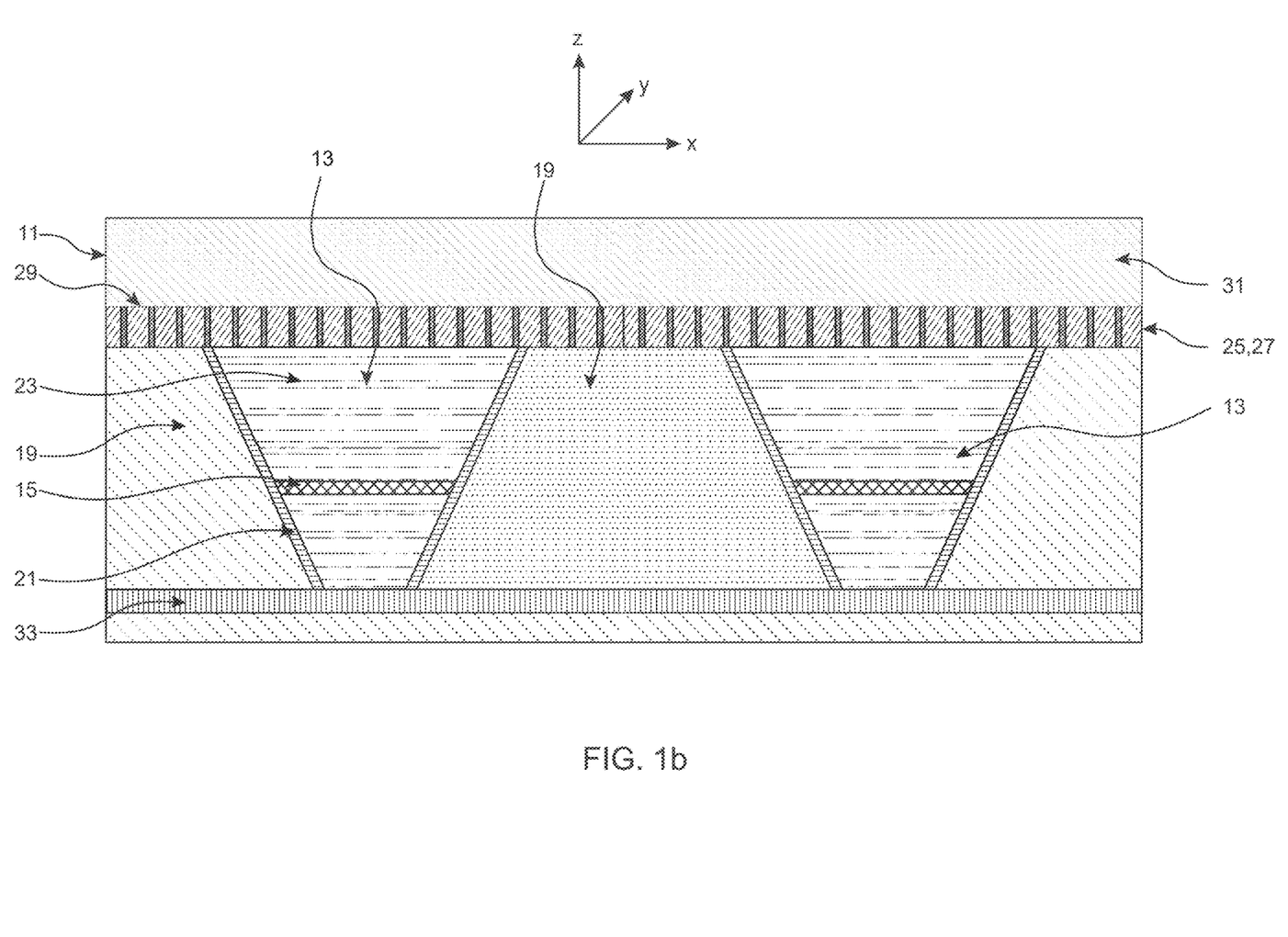
FIG. 1b shows schematically a cross-sectional view of an exemplary embodiment of an optoelectronic device in accordance with the present invention.

The optoelectronic light source 13 can be arranged in an array-like structure of a plurality of optoelectronic light sources 13. (FIG. 1b). The photonic crystal structure 27 helps to avoid or reduce crosstalk between the optoelectronic light sources 13 of the array of light sources. Crosstalk mainly occurs when light travels along the electrically conductive layer 25 from one light source 13 to a neighboring light source 13. There, the light may disturb the light generating process in the active zone 15 of the neighboring light source 13.

Figure 2:
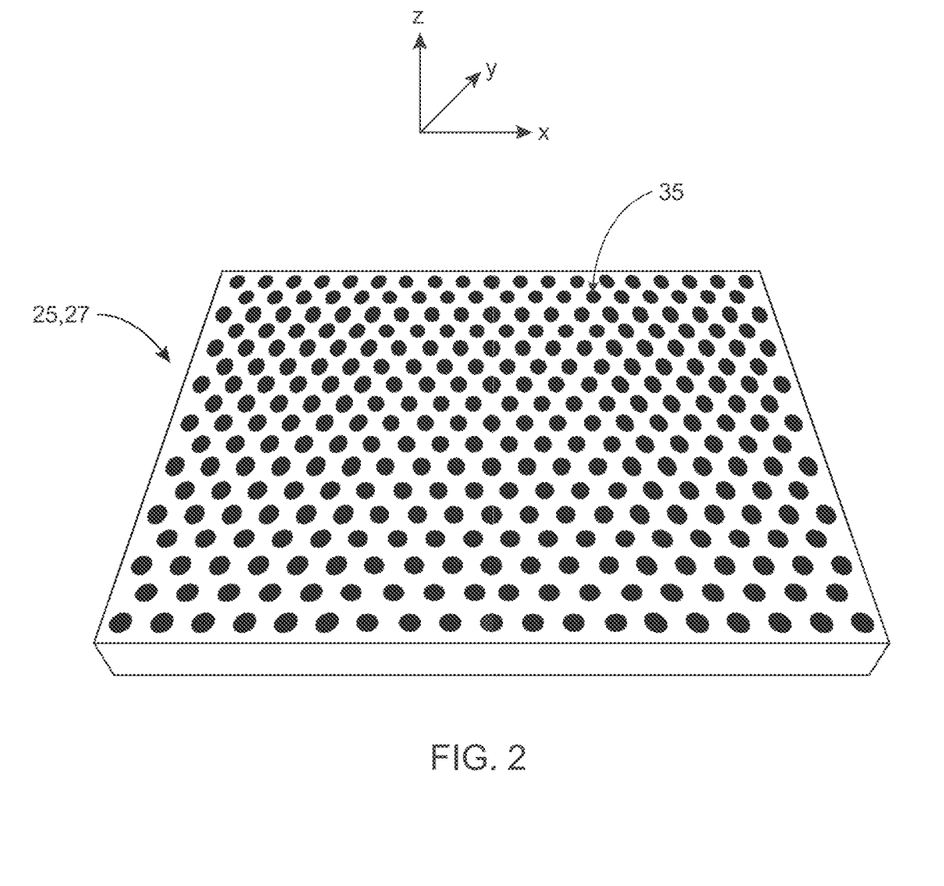

As shown in FIG. 2, the photonic crystal structure 27 in the electrically conductive layer 25 is a 2-dimensional hexagonal photonic crystal structure. The structure has a periodic or quasi-periodic variation of the index of refraction along the x-axis and along the y-axis. The x-axis and the y-axis are perpendicular to each other and they lie in a plane that is parallel to the light emitting surface 29. In other words, the x-axis and the y-axis are orthogonal to the z-axis, which is orthogonal to the light emitting surface 29. The z-axis corresponds to the main direction of the light that is emitted by the optoelectronic device.

The photonic crystal structure 27 comprises a plurality of holes 35 arranged in a hexagonal lattice structure. The holes 35 may have been etched into the electrically conductive layer 25, in particular such that the dimensioning of the lattice causes the creation of a bandgap (not shown) that covers the wavelengths of the light emitted by the optoelectronic light source 13. The holes 35 can be filled with a dielectric material having an index of refraction that differs from the index of refraction of the electrically conductive layer 25. Alternatively, the holes 35 can contain air.

As the periodicity of the structure extends in the xy-plane, the bandgap is in particular relevant for the propagation of light in the conductive layer 25 along a lateral direction, i.e. a propagation direction in the xy-plane. The bandgap can be a partial bandgap as engineering a complete bandgap for the emission wavelength might not be feasible due to restriction in dimension and materials. The bandgap can prevent light from traveling in the lateral direction within the conductive layer 25 if the wavelength of the light is in the bandgap. Thereby, crosstalk between neighboring light sources of an array of light sources 13 that share the electrically conductive layer 25 can be prevented or reduced.

Figure 3:
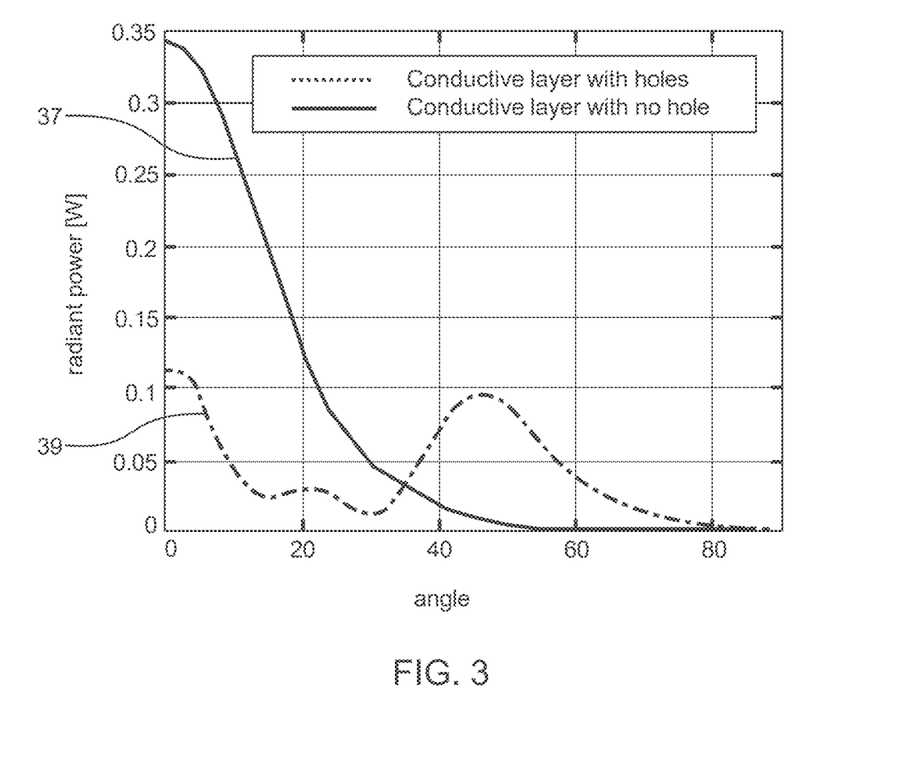
FIG. 3 shows schematically the radiant power per solid angle as a function of the direction of emission of the device of FIG. 1a and of a corresponding device, but which has an unstructured electrically conductive layer.

FIG. 3 shows radiant power per solid angle as a function of the direction of emission. The direction of the emission is given by an angle which is measured with respect to a normal axis (see the z-axis in FIG. 1a) that is perpendicular to the light emitting surface. Specifically, FIG. 3 shows a first curve 37 that relates to the radiant power per solid angle as a function of the direction of emission for a device with a photonic crystal structure 27 as shown in FIG. 1a. Furthermore, FIG. 3 shows a second curve 39 of a corresponding de-vice, but which does not have the photonic crystal structure 27 in its electrically conductive layer 25. Both profiles are shown for the farfield.

As shown in FIG. 3, the first curve 37 is more confined than the second curve 39. The photonic crystal structure 27 therefore helps with coupling guided modes in the photonic crystal structure 27 to an extraction cone as represented by first curve 37 resulting in enhanced light extraction and in an improved directionality.

Figure 4:
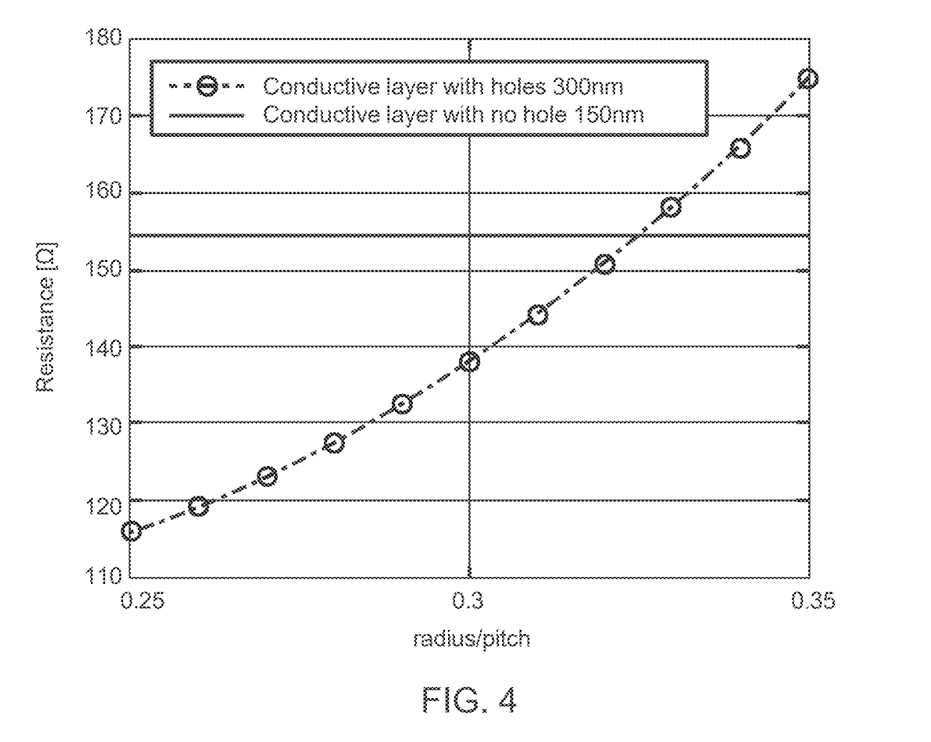
FIG. 4 shows a diagram that illustrates the electrical resistance of a conductive layer with holes as a function of the ratio between hole radius and pitch.

FIG. 4 shows a diagram that illustrates the electrical resistance of a conductive layer 25 with a thickness of 300 nm and with holes 35 (see FIG. 2) forming a photonic crystal structure as a function of the ratio between hole radius and pitch. As an example, a 150 nm thick electrically conductive layer, which does not have any holes has a resistance of about 155 Ohm (see the horizontal line in FIG. 4). The electrically conductive layer 25 with holes in a hexagonal structure has double the thickness. Yet at a radius/pitch lower than 0.33 it shows a lower resistance. The resistance of the conductive layer 25 with holes can further drop if the thickness of the layer is increased. Thus, a thicker conductive layer 25 with holes 35 in addition to the presence of a photonic bandgap which prevents any crosstalk can have a lower resistance than a thinner unstructured layer, as the thicker structured layer 25 can consist of more conductive material.

In a preferred embodiment using ITO as material for the electrically conductive layer 25, the following dimensions apply:

a=520 nm, r/a=0.30, d=150 mm, Po=0.27, Pc=0.01.

In a further preferred embodiment, the following dimensions apply:

a=540 nm, r/a=0.33, d=300 nm, Po=0.30, Pc=0.01.

"a" refers to the pitch, "r" refers to the radius of the holes, "d" refers to the thickness of the layer 25 measured along the z-axis. Po is the cumulative light output of a light source that is emitted out-of-plane divided by the emitted power from the source in the active zone. Pc is the cumulative light output of a light source that is transferred to the adjacent cells divided by the emitted power.

The pitch "a" is the center-to-center distance between two neighboring holes in a hexagonal lattice.

With the given dimensions, a tolerance of ±10 nm in the radius does not influence the out-couple power as well as the crosstalk via the electrically conductive layer 25. This makes the photonic structure resilient to fabrication tolerances.

The thickness of the electrically conductive layer 25 is of importance in optoelectronic light sources that are µLEDs. On one hand making it less than 200 nm can be challenging and will reduce the conductivity of such a layer. On the other hand, a thick unstructured conductive layer 25 will result in crosstalk. Patterning the conductive layer 25 with a photonic crystal structure that has a photonic bandgap at the emission line of the light sources can result in total suppression of crosstalk and at the same time can allow electric current to flow.

From the viewpoint of optimizing the photonic bandgap the thicker the conductive layer 25 the better it would be. This is because the 2D photonic structure will give a broad frequency bandgap when the thickness is equal or less than the lattice constant. In an example, an optimal lattice constant for light extraction is calculated at 540 nm so the closer to this thickness the broader the bandgap.

A PLED as optoelectronic light source 13 can have a size in the range between 10 µm and 1 µm, preferably between 5 µm and 1 µm and further preferably between 2 µm and 1 µm. The size is measured along the x-axis or along the y-axis. The height is measured along the z-axis.

Figure 5:
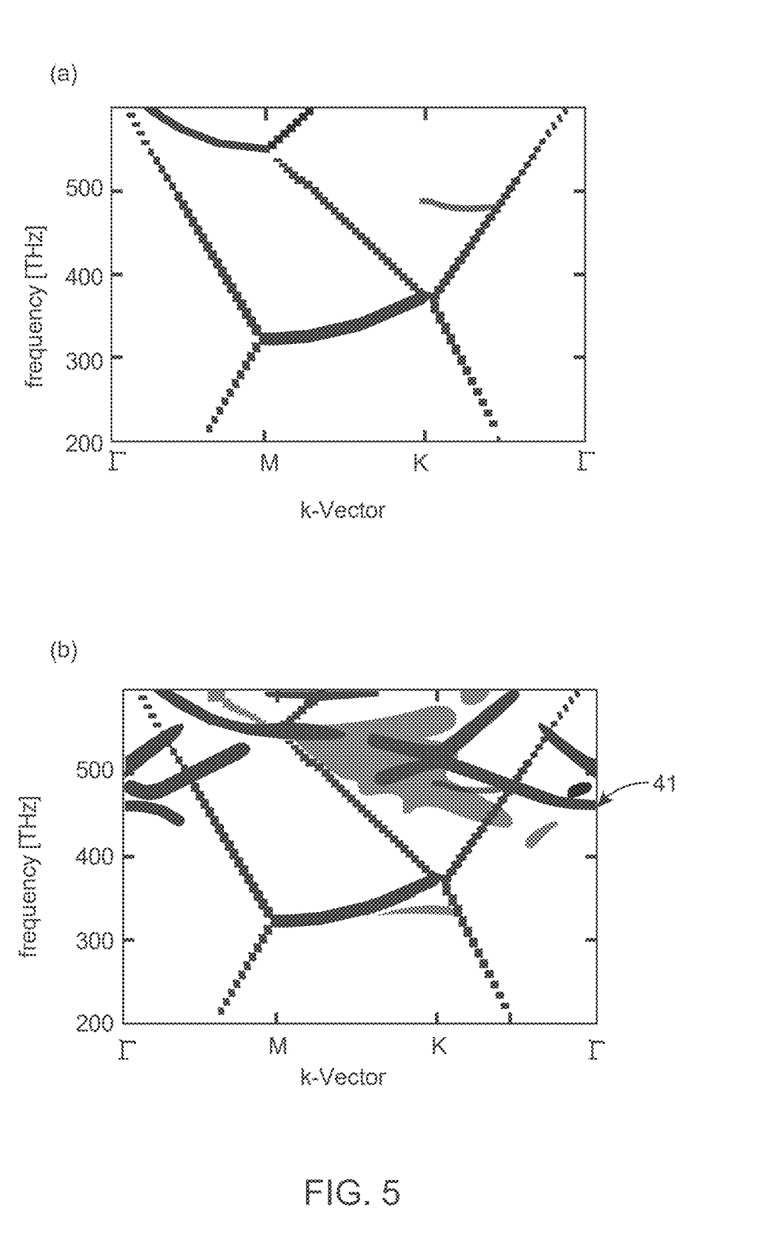
FIG. 5a shows a photonic bandstructure diagram.
FIG. 5b shows another photonic bandstructure diagram.

FIG. 5a shows a photonic bandstructure diagram for a conductive layer 25 with a photonic crystal structure realized by a triangular lattice of holes 35 with a pitch of 540 nm and a hole radius of 178.2 nm. The layer has a thickness of 150 nm. A bandstructure diagram corresponds to a dispersion diagram showing frequency over wavenumber for a photonic structure, and the bandstructure diagram depicts which modes are allowed to propagate and which modes are prohibited. The center of the radiation cone coincides with the Gamma "Γ"-point, the high symmetry point in the Brillouin zone where kx=ky=0. At this point radiation modes radiate out-of-plane in the z-direction.

FIG. 5b shows a photonic bandstructure diagram for a conductive layer 25 similar to the one of FIG. 5a, but the conductive layer 25 related to the bandstructure diagram of FIG. 5b has a thickness of 300 nm. A high concentration of modes at the Gamma point around the emission frequency means higher out-of-plane emission or higher light extraction efficiency. Thus, a high concentration of optical modes at the high symmetry Gamma "Γ"-point and around the emission frequency of the light source 13 results in enhanced light extraction and of a coupling of the optical mode to the light extraction cone.

The conductive layer related to FIG. 5b is twice as thick as the conductive layer related to FIG. 5a, but it gives due to the bandstructure around 36% more output power emission compared to FIG. 5a. In addition to creating a bandgap for crosstalk suppression, a photonic crystal structure can couple guided modes and trapped modes to an extraction cone of the emitted light. Modes in the extraction cone are present near the r-point.

In view of the above, some advantages of a photonic crystal structured conductive layer 25 on microLEDs are:
1. Light extraction efficiency (LEE) enhancement up to 50%
2. Suppressing crosstalk
3. Enhanced current spreading
4. Directionality
5. Increasing pixel density—due to suppression of crosstalk
6. Helping with the geometry—µLEDs are very sensitive to resonances and a LEE layer would allow for more relaxed fabrication tolerances and different geometries.

LIST OF REFERENCE SIGNS 11 outer frame
13 optoelectronic light source
15 active region, active zone
19 mesa boundary
21 metal and passivation layer
23 epitaxial layers
25 electrically conductive layer
27 photonic crystal structure
29 light emitting surface
31 air
33 metallic layer
35 holes
37 first curve
39 second curve
41 photonic bands

The invention claimed is:

1. An optoelectronic device comprising:
   at least one optoelectronic light source having an active region for generating light and a light emitting surface for emitting the generated light,
   an electrically conductive layer extending between the light emitting surface and the active region, wherein the active region is embedded in a funnel-like mesa boundary, and
   a photonic crystal structure arranged in the electrically conductive layer,
   wherein the at least one optoelectronic light source is a plurality of optoelectronic light sources, the optoelectronic light sources of the plurality of optoelectronic light sources are arranged in an array-like structure, and each of the optoelectronic light sources has an active region which is separate from the active regions of the other optoelectronic light sources, and
   wherein the electrically conductive layer extends over all optoelectronic light sources of the plurality of optoelectronic light sources.

2. The optoelectronic device in accordance with claim 1, wherein the photonic crystal structure is a 2-dimensional photonic crystal structure.

3. The optoelectronic device in accordance with claim 1, wherein the photonic crystal structure provides a photonic bandgap or a partial photonic bandgap at least for electromagnetic radiation of a given wavelength or in a given wavelength regime that propagates in a lateral direction, the lateral direction being parallel to the light emitting surface.

4. The optoelectronic device in accordance with claim 1, wherein the photonic crystal structure comprises a plurality of holes formed in the electrically conductive layer, the holes forming a lattice, such as a hexagonal lattice.

5. The optoelectronic device in accordance with claim 4, wherein the holes are filled with a dielectric material having an index of refraction that differs from the index of refraction of the electrically conductive layer.

6. The optoelectronic device in accordance with claim 4, wherein each hole comprises a center axis, the center axes of the plurality of holes are arranged in parallel to each other and/or the center axes of the plurality of holes are arranged orthogonal to the light emitting surface.

7. The optoelectronic device in accordance with claim 4, wherein each hole has a circular cross section.

8. The optoelectronic device in accordance with claim 1, wherein the at least one optoelectronic light source is a μLED, with a size of 1 μm to 10 μm.

9. The optoelectronic device in accordance with claim 1, wherein the electrically conductive layer has a height of 140 nm to 350 nm.

10. The optoelectronic device in accordance with claim 1, wherein the electrically conductive layer is made of Indium tin oxide (ITO).

11. The optoelectronic device in accordance with claim 1, wherein the photonic crystal structure is formed by a hexagonal pattern of holes in the electrically conductive layer and has a thickness of 300 nm, a hole radius of 178.2 nm, and a pitch of 540 nm.

12. The optoelectronic device in accordance with claim 1, wherein the photonic crystal structure has a thickness, and a pitch and radius of holes, such that trapped modes and/or guided modes couple to an extraction cone.

13. The optoelectronic device in accordance with claim 1, wherein the at least one optoelectronic light source is a μLED, with a size of 1 μm to 5 μm.

14. The optoelectronic device in accordance with claim 1, wherein the at least one optoelectronic light source is a μLED, with a size of 1 μm to 2 μm.

15. The optoelectronic device in accordance with claim 1, wherein the electrically conductive layer has a height of 150 nm to 300 nm.

16. A method for producing an optoelectronic device, the method comprising:
    providing at least one optoelectronic light source having an active region for generating light,
    providing an electrically conductive layer above the active region, wherein the active region is embedded in a funnel-like mesa boundary, and
    generating a photonic crystal structure in the electrically conductive layer,
    wherein the at least one optoelectronic light source is a plurality of optoelectronic light sources, and
    wherein the electrically conductive layer is provided on the optoelectronic light sources of the plurality of optoelectronic light sources such as to extend over all the optoelectronic light sources.

17. The method in accordance with claim 16, wherein the method further comprises:
    arranging the optoelectronic light sources of the plurality of optoelectronic light sources in an array-like structure, each of the optoelectronic light sources having an active region which is separate from the active regions of the other optoelectronic light sources.

18. The method in accordance with claim 17, wherein the optoelectronic light sources are individual μLEDs arranged in the array-like structure.

19. The method in accordance with claim 16, wherein the optoelectronic light sources are individual μLEDs arranged in an array-like structure.

* * * * *